(12) United States Patent
Otake

(10) Patent No.: US 8,237,241 B2
(45) Date of Patent: Aug. 7, 2012

(54) SEMICONDUCTOR DEVICE

(75) Inventor: Seiji Otake, Kumagaya (JP)

(73) Assignees: SANYO Semiconductor Co., Ltd., Gunma (JP); Semiconductor Components Industries, LLC, Phoenix, AZ (US)

( * ) Notice: Subject to any disclaimer, the term of this patent is extended or adjusted under 35 U.S.C. 154(b) by 351 days.

(21) Appl. No.: 12/692,341

(22) Filed: Jan. 22, 2010

(65) Prior Publication Data

US 2010/0187653 A1    Jul. 29, 2010

(30) Foreign Application Priority Data

Jan. 28, 2009    (JP) ................................ 2009-016230

(51) Int. Cl.
*H01L 29/86* (2006.01)
(52) U.S. Cl. .. 257/530; 257/139; 257/335; 257/E29.325
(58) Field of Classification Search .................. 257/139, 257/335, 530, E29.325, E29.184, E29.266
See application file for complete search history.

(56) References Cited

FOREIGN PATENT DOCUMENTS

JP    2007-317869    12/2007

*Primary Examiner* — Benjamin Sandvik
*Assistant Examiner* — Whitney T Moore
(74) *Attorney, Agent, or Firm* — Morrison & Foerster LLP

(57) ABSTRACT

A conventional semiconductor device has a problem that an on-current of a parasitic transistor flows through a surface portion of a semiconductor layer and thus a semiconductor element undergoes thermal breakdown. In a semiconductor device according to the present invention, a protection element is formed with use of an isolation region and N type buried layers. A PN junction region in the protection element is formed on a P type buried layer of the isolation region. The PN junction region has a junction breakdown voltage lower than that of a PN junction region of a semiconductor element to be protected. This structure allows an on-current of a parasitic transistor to flow into the protection element, and thereby the semiconductor element is protected. In addition, the on-current of the parasitic transistor flows through a deep portion of the epitaxial layer, and thereby the protection element is prevented from thermal breakdown.

8 Claims, 7 Drawing Sheets

Prior Art

SEMICONDUCTOR DEVICE

This application claims priority from Japanese Patent Application Number JP 2009-016230 filed on Jan. 28, 2009, the content of which is incorporated herein by reference in its entirety.

BACKGROUND OF THE INVENTION

1. Field of the Invention

The present invention relates to a semiconductor device which is prevented from breaking down due to a surge voltage such as electrostatic discharge (hereinafter, referred to as ESD).

2. Description of the Related Art

In one example, a conventional semiconductor device having the following structure is known. FIG. 10 is a cross-sectional view illustrating the conventional semiconductor device.

As shown in FIG. 10, an N type epitaxial layer 163 is formed on a P type semiconductor substrate 162. A diffused resistor 161 is formed in the epitaxial layer 163. A P type diffusion layer 164 is formed in the epitaxial layer 163, and P type diffusion layers 165, 166 are formed to overlap the P type diffusion layer 164. A high potential (VH) such as a power supply potential (Vcc) is applied to the P type diffusion layer 165, while a low potential (VL) such as a ground potential is applied to the P type diffusion layer 166.

In addition, a P type diffusion layer 168 and an N type diffusion layer 169 are formed in the epitaxial layer 163 at a portion along the inner circumference of an isolation region 167. The P type diffusion layer 168 and the N type diffusion layer 169 form a PN junction region 170. The N type diffusion layer 169 partly overlaps a P type diffusion layer 171 of the isolation region 167. The PN junction region 170 has a junction breakdown voltage lower than that of a PN junction region 172 of the diffused resistor 161. When a surge voltage such as an ESD surge is applied to the diffused resistor 161, the PN junction region 170 breaks down prior to the PN junction region 172 and thereby the diffused resistor 161 is protected. An on-current I8 generated in a parasitic transistor Tr (hereinafter, may be referred to as a parasitic Tr) flows into the substrate 162 through the isolation region 167. This technology is described for instance in Japanese Patent Application Publication No. 2007-317869 (pp. 6-8, FIG. 1).

As described above, in the conventional semiconductor device, when a surge voltage such as an ESD surge is applied to the diffused resistor 161, the PN junction region 170 breaks down prior to the PN junction region 172, and then the on-current I8 of the parasitic Tr is generated. A protection element including the P type diffusion layers 168, 171 and the N type diffusion layer 169 is formed in a surface portion of the epitaxial layer 163, and hence the on-current I8 of the parasitic Tr flows into the substrate 162 through the surface portion of the epitaxial layer 163. Here, an insulating layer having a thermal conductivity lower than that of silicon is stacked on formation regions of the P type diffusion layers 168, 171 and the N type diffusion layer 169, and hence the surface portion of the epitaxial layer 163 has poor heat dissipation. The on-current I8 of the parasitic Tr is so large that the heat caused by the on-current I8 of the parasitic Tr may lead to thermal breakdown of the surface portion of the epitaxial layer 163 (the formation region of the P type diffusion layers 168, 171 and the N type diffusion layer 169).

SUMMARY OF THE INVENTION

The invention provides a semiconductor device that includes a semiconductor layer, an isolation region dividing the semiconductor layer into a plurality of element-formation regions, a semiconductor element formed in a first element-formation region of the element-formation regions, a first diffusion layer formed in the first element-formation region and forming a first PN junction region with the isolation region that defines the first element-formation region, and a second diffusion layer formed in a second element-formation region of the element-formation regions. The first and second element-formation regions are disposed next to each other so as to be divided by the isolation region, and different voltages are applied to the first and second diffusion layers. A junction breakdown voltage of the first PN junction region is lower than a junction breakdown voltage of an element PN junction region included in the semiconductor element. The first and second diffusion layers are each disposed at a bottom portion of the semiconductor layer and each have a lower resistance than the semiconductor layer. At a time of breakdown, a current path is formed between the first and second diffusion layers through the isolation region.

DESCRIPTION OF THE INVENTIONS

Hereinafter, semiconductor devices according to preferred embodiments of the present invention will be described in detail with reference to FIGS. 1A to 9. FIGS. 1A to 2B are cross-sectional views each for illustrating a protection element of the semiconductor device according to the embodiment. FIGS. 3A and 3B are plan views for illustrating the protection element of the semiconductor device according to the embodiment. FIGS. 4 to 9 are cross-sectional views each for illustrating a protection element of the semiconductor device according to the embodiments.

Figure 1A:
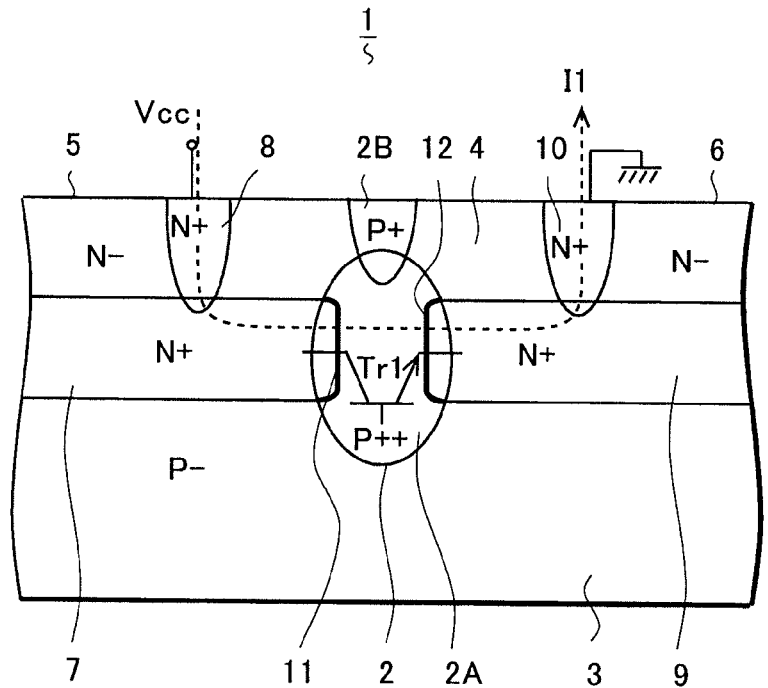
FIGS. 1A and 1B are cross-sectional views illustrating a semiconductor device according to a preferred embodiment of the present invention.

As shown in FIG. 1A, a protection element 1 that prevents breakdown due to a surge voltage such as electrostatic discharge (hereinafter, referred to as ESD) is formed with use of an isolation region 2. Forming the protection element with use of the isolation region 2 allows the protection element 1 to be efficiently disposed in an active region, and thus the efficient use of the active region is achieved. Specifically, an N type epitaxial layer 4 is formed on a P type single-crystal silicon substrate 3. The isolation region 2 is formed of a P type buried layer 2A and a P type diffusion layer 2B. A diffusion depth (a downward expansion width) of the diffusion layer 2B from the top surface of the epitaxial layer 4 is smaller than a diffusion depth (an upward expansion width) of the buried layer 2A from the top surface of the substrate 3. Thereby, a formation region of the isolation region 2 is reduced in size. The isolation region 2 is connected to the substrate 3, and divides the epitaxial layer 4 into multiple element-formation regions 5, 6. It is noted that conductivity types such as N+, N and N− belong in one general conductivity type and conductivity types such as P+, P and P− belong in the other general conductivity type.

A desired semiconductor element is formed in the element-formation region 5 as described in FIGS. 2A to 8 below. In the element-formation region 5, an N type buried layer 7 is placed between the substrate 3 and the epitaxial layer 4. This N type buried layer 7 is formed by diffusing impurities into both the epitaxial layer and the substrate. The N type buried layer 7 is connected to an N type diffusion layer 8 formed in the epitaxial layer 4, and is also connected to the P type buried layer 2A. The N type diffusion layer 8 is applied with a high potential such as a power supply potential (Vcc), a collector potential of an NPN transistor, a drain potential of an N channel type MOS transistor. Meanwhile, also in the element-formation region 6, an N type buried layer 9 is placed between the substrate 3 and the epitaxial layer 4. The N type buried layer 9 is also formed by diffusing impurities into both the epitaxial layer and the substrate. The N type buried layer 9 is connected to an N type diffusion layer 10 formed in the epitaxial layer 4, and is also connected to the P type buried layer 2A. A ground potential (GND), for example, is applied to the N type buried layer 9. Note that the N type buried layer 9 does not always need to be disposed in the element-formation region 6, and has only to be disposed along the outer circumference of the isolation region 2 that defines the element-formation region 5.

A parasitic NPN transistor 1 (hereinafter, referred to as a parasitic Tr1) including the N type buried layers 7, 9 and the P type isolation region 2 is formed around the element-formation region 5. First, the parasitic Tr1 has a PN junction region 11 and a PN junction region 12 formed therein as indicated by the bold lines. The PN junction region 11 is formed by the N type buried layer 7 and the P type buried layer 2A, and the PN junction region 12 is formed by the N type buried layer 9 and the P type buried layer 2A. The N type buried layer 7 is applied with a high potential such as a power supply potential (Vcc) as described above, while the isolation region 2 is connected to the substrate 3 and thus has a ground potential (GND). Thereby, a reverse bias is applied to the PN junction region 11. On the other hand, the N type buried layer 9 has a ground potential (GND), which is substantially the same potential as the P type buried layer 2A has, and thereby the PN junction region 12 is not driven.

Here, the PN junction region 11 is formed to have a junction breakdown voltage lower than that of a to-be-protected PN junction region (not illustrated) of the semiconductor element in the element-formation region 5. The junction breakdown voltage of the PN junction region 11 is adjusted to have a desired characteristic value by setting the impurity concentrations of the N type buried layer 7 and the P type buried layer 2A to be high. The N type diffusion layer 8 is electrically connected to N type diffusion layers (such as a collector diffusion layer and a drain diffusion layer) forming the to-be-protected PN junction region in the semiconductor element.

With this structure, when a positive ESD surge (surge voltage) is applied to a collector electrode or a drain electrode of the semiconductor element, the PN junction region 11 breaks down, and then an on-current I1 of the parasitic Tr1 flows into the P type buried layer 2A. The potential of the P type buried layer 2A serving as a base region of the parasitic Tr1 rises with the on-current I1 of the parasitic Tr1 flowing thereinto. Then, the parasitic Tr1 is turned on with a forward bias applied to the PN junction region 12 in conjunction with the operation of the PN junction region 11. Subsequently, in the parasitic Tr1, conductivity modulation occurs in a collector region, the resistance value decreases to a large extent, and the current capability improves. As a result, the on-current I1 of the parasitic Tr1 increases and flows through the PN junction region 11, and thereby the semiconductor element can be protected from the positive ESD surge.

Further, the N type diffusion layers 7 to 10 and the P type buried layer 2A, which are high concentration layers are connected to thereby form a low resistance region, and hence the on-current I1 of the parasitic Tr1 flows preferentially through the connected diffusion layers described above. Moreover, the on-current I1 of the parasitic Tr1 flows through the N type buried layer 7 having lower resistance than the epitaxial layer 4 due to the conductivity modulation. Thus, it is considered that the amount of current flowing through the surface portion of the epitaxial layer 4 is substantially suppressed. Here, heat dissipation in the surface portion of the epitaxial layer 4 is degraded by an insulating layer (a silicone oxide film, a TEOS film, a BPSG film, an SOG film, and the like) because silicon (epitaxial layer) has a thermal conductivity higher than that of the insulating layer. In other words, the on-current I1 of the parasitic Tr1 flows through the N type buried layer 7, which has a high thermal conductivity all around the epitaxial layer 4, and hence the protection element 1 is prevented from thermal breakdown due to the on-current I1 of the parasitic Tr1. Note that most of, if not all of, the on-current I1 of the parasitic Tr1 flows through the N type buried layers 7 and 9 and buried layer 2A, which have a low resistance, and hence a current concentration is prevented in the surface portion of the epitaxial layer 4. The N type buried layers 7 and 9 and buried layer 2A are collectively called a deep portion, herein after. Thereby, the surface portion of the epitaxial layer 4 is prevented from the thermal breakdown due to the on-current I1 of the parasitic Tr1.

In addition, the protection element 1 is formed with use of the isolation region 2 that defines the element-formation region 5. Thereby, the N type buried layer 7 may be formed all over the element-formation region 5, and the PN junction region 11 may be formed in an endless shape all around the isolation region 2. This structure prevents the on-current I1 of the parasitic Tr1 from concentrating locally at a particular region, and thus prevents the PN junction region 11 itself from breaking down by the current concentration.

Moreover, the protection element 1 is formed for each element-formation region with use of the isolation region. This structure enables the junction breakdown voltage to be determined for each semiconductor element formed in the corresponding element-formation region defined by the isolation region. In other words, disposed is one protection element 1 appropriate for each semiconductor element, and thereby the semiconductor element is protected from an ESD surge or the like.

Figure 1B:
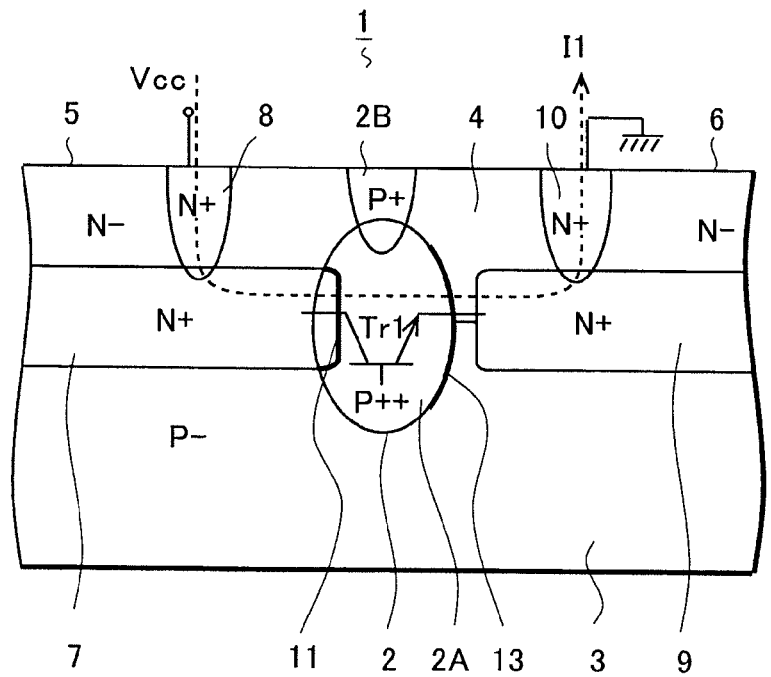

The protection element 1 can exert a similar effect in a structure as shown in FIG. 1B in which the N type buried layer 9 is not connected to the P type buried layer 2A. In the protection element 1, the PN junction region 11 breaks down as described above, which in turn causes a PN junction region 13 to operate. Since the N type buried layer 9 is disposed in a region near the P type buried layer 2A, the on-current I1 of the parasitic Tr1 flows through the N type buried layer 9 being a low resistance region, and hence the surface portion of the epitaxial layer 4 is prevented from the thermal breakdown.

Figure 2A:
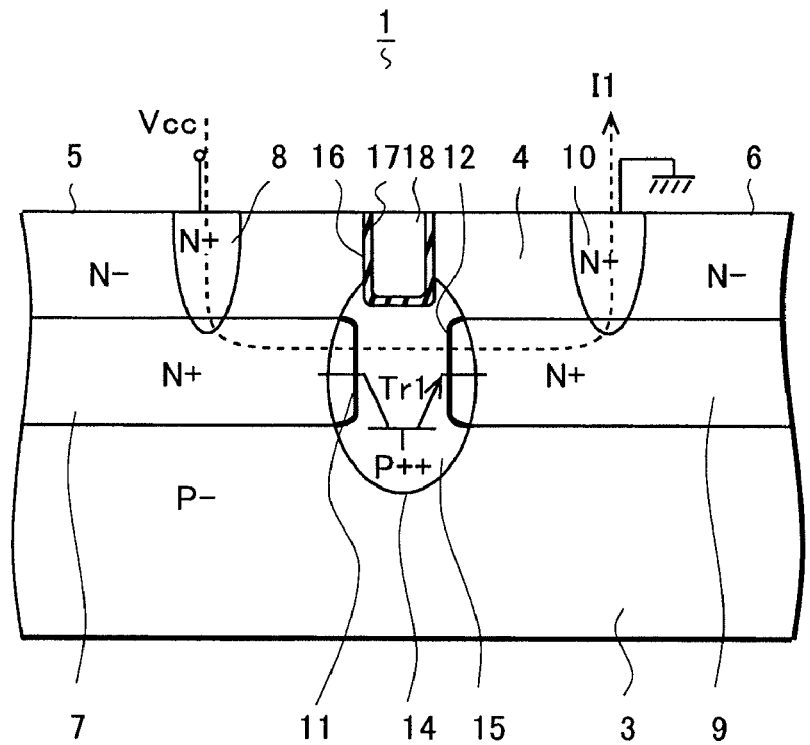
FIGS. 2A and 2B are cross-sectional views illustrating a semiconductor device according to a preferred embodiment of the present invention.
Figure 3A:
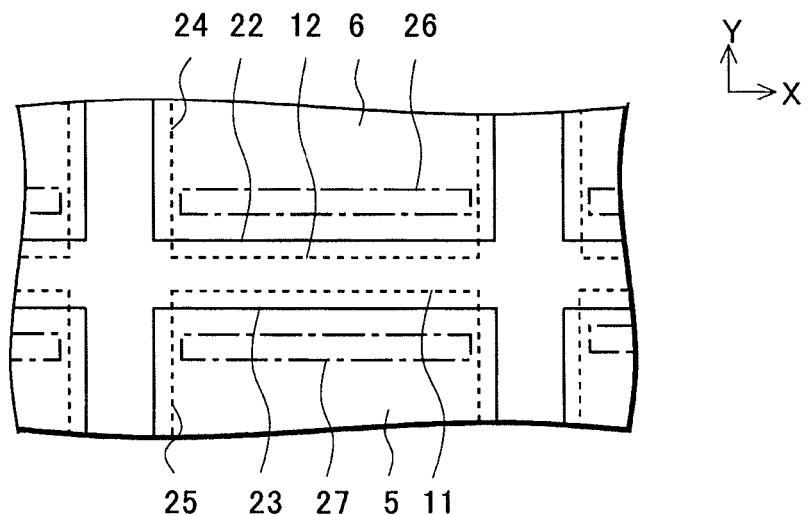
FIGS. 3A and 3B are plan views illustrating the semiconductor device according to the preferred embodiment of the present invention.
Figure 3B:
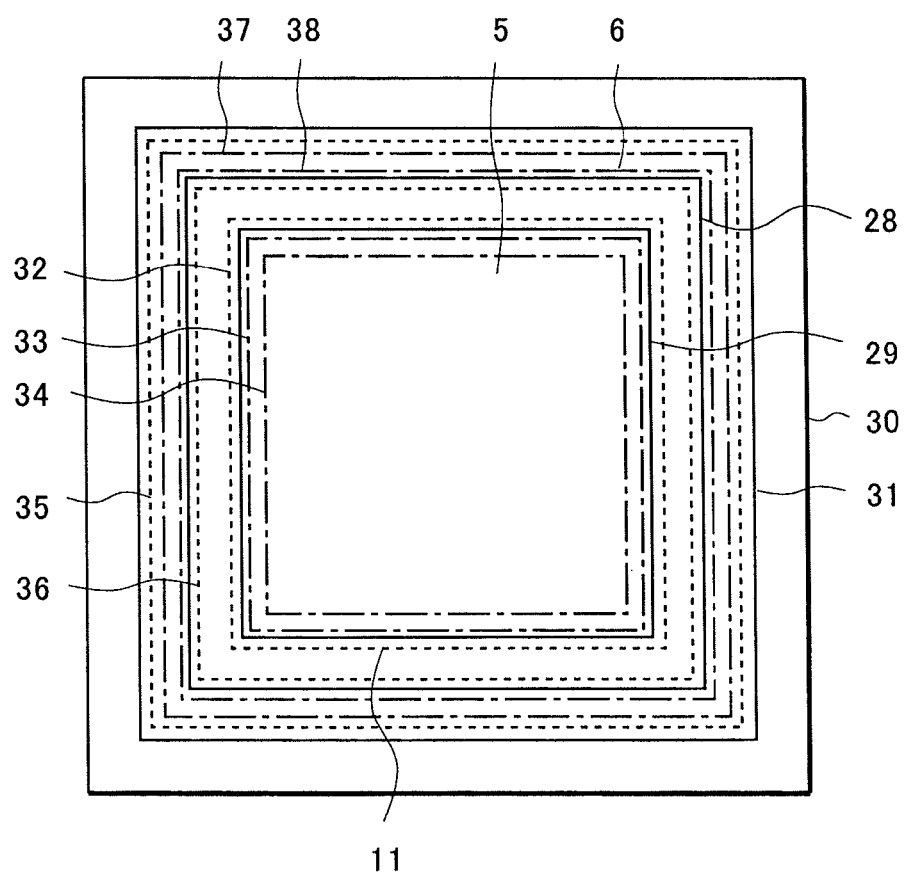

As shown in FIG. 2A, an isolation region 14 may be formed with use of a trench 16. Note that the other components in the structure illustrated in FIG. 2A are the same as in FIG. 1A. Accordingly, the same reference numerals as in FIG. 1A are used to denote the other components in FIG. 2A, and the descriptions of FIG. 1A are referred to for the other components in FIG. 2A. Although the description of the isolation region 14 in FIG. 2A is omitted here, the isolation region 14 can also be employed in the structure illustrated in FIG. 1B.

Specifically, the trench 16 is formed to reach a P type buried layer 15 included in the isolation region 14. A silicon oxide film 17 is formed on the inner wall of the trench 16, in which a polycrystalline silicon film 18, for example, is buried. Note that an insulating film such as a non-doped-silicate glass (NSG) film and a high temperature oxide (HTO) film may be buried in the trench 16 instead of the polycrystalline silicon film 18.

With this structure, the on-current I1, generated by a positive ESD surge, of the parasitic Tr1 is prevented from flowing through the surface portion of the epitaxial layer 4. Thereby, the surface portion of the epitaxial layer 4 is protected from the thermal breakdown due to the on-current I1 of the parasitic Tr1.

Figure 2B:
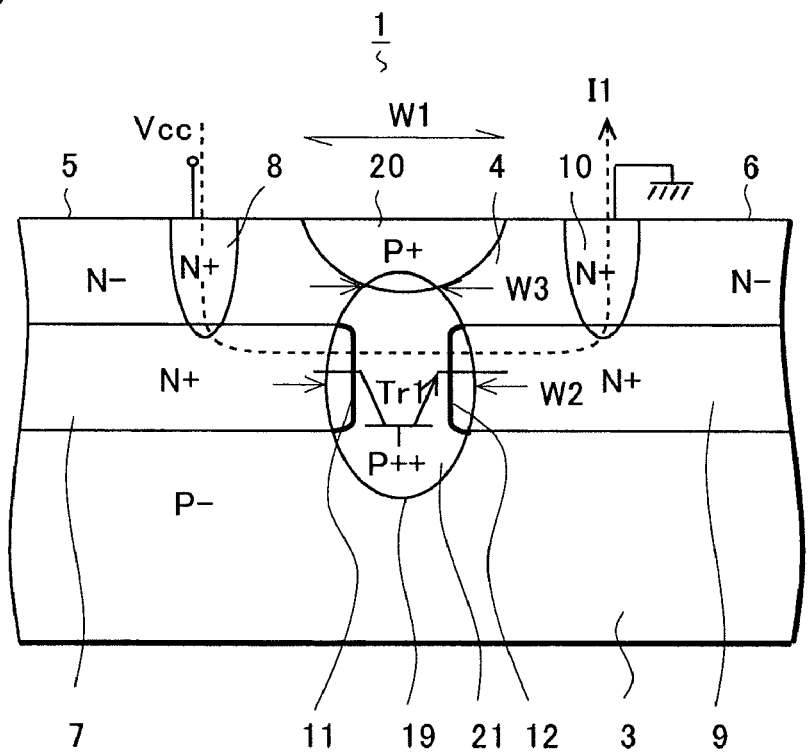

As shown in FIG. 2B, a P type diffusion layer 20 on an isolation region 19 may be formed to have a large width. Note that the other components in the structure illustrated in FIG. 2B are the same as in FIG. 1A. Accordingly, the same reference numerals as in FIG. 1A are used to denote the other components in FIG. 2B, and the descriptions of FIG. 1A is referred to for the other components in FIG. 2B. Although the description of the isolation region 19 in FIG. 2B is omitted here, the isolation region 19 can also be employed in the structure illustrated in FIG. 1B.

Specifically, in the isolation region 19, a diffusion width W1 of the P type diffusion layer 20 is set larger than a diffusion width W2 of a P type buried layer 21, and accordingly a width W3 of an overlapping region of the P type diffusion layer 20 and the buried layer 21 is made large. In this overlapping region, low-concentration regions respectively of the P type diffusion layer 20 and the buried layer 21 overlaps each other. Accordingly, by making the width W3 of the overlapping region large, an operation of the parasitic Tr1 in the overlapping region is suppressed. Moreover, by increasing the diffusion width W1 of the P type diffusion layer 20, an operation of the parasitic Tr1 in this region is suppressed.

This structure proactively makes the parasitic Tr1 to operate in a high-concentration region of the P type buried layer 21, and hence the on-current I1 of the parasitic Tr1 do not easily flow through the surface portion of the epitaxial layer 4. Thereby, the surface portion of the epitaxial layer 4 is protected from the thermal breakdown due to the on-current I1 of the parasitic Tr1.

FIG. 3A is a plan view of an example of the protection element using the isolation region. Descriptions here are given with reference to the structure in FIG. 1A. A region defined by solid lines 22, 23 indicates a formation region of the P type buried layer 2A of the isolation region 2. For example, an inner region surrounded by the solid line 22 corresponds to the element-formation region 6, and an inner region surrounded by the solid line 23 corresponds to the element-formation region 5. A region surrounded by a dotted line 24 corresponds to a formation region of the N type buried layer 9, and a region surrounded by a dotted line 25 corresponds to a formation region of the N type buried layer 7. A region surrounded by a dashed-dotted line 26 corresponds to a formation region of the N type diffusion layer 10, and a region surrounded by a dashed-dotted line 27 corresponds to a formation region of the N type diffusion layer 8. As shown in FIG. 3A, the N type buried layers 7, 9 are connected to the P type buried layer 2A extending in the X-axis direction in the drawing, and thus the PN junction regions 11, 12 are formed. In this example, the PN junction regions are formed on the P type buried layer 2A extending in the X-axis direction in the drawing in the respective element-formation regions.

FIG. 3B is a plan view of another example of the protection element using the isolation region. Descriptions here are given with reference to the structure in FIG. 1A. A region defined by solid lines 28, 29 indicates a formation region of the P type buried layer 2A of the isolation region 2. For example, an inner region surrounded by the solid line 29 corresponds to the element-formation region 5. A region defined by solid lines 30, 31 indicates a formation region of a P type buried layer of another isolation region, and for example, a region defined by the solid lines 28, 31 corresponds to the element-formation region 6. A region surrounded by a dotted line 32 corresponds to a formation region of the N type buried layer 7, and the PN junction region 11 is formed in an endless shape along the P type buried layer 2A surrounding the element-formation region 5. A region defined by dashed-dotted lines 33, 34 corresponds to a formation region of the N type diffusion layer 8.

Meanwhile, in the element-formation region 6, a region defined by dotted lines 35, 36 corresponds to a formation region of the N type buried layer 9, and the PN junction region 12 is formed in an endless shape along the P type buried layer 2A. A region defined by dashed-dotted lines 37, 38 corresponds to a formation region of the N type diffusion layer 10.

This structure allows the protection element to be formed in an endless shape around the element-formation region 5 with use of the P type buried layer 2A.

Note that, in this embodiment, the description has been given for the case where the isolation region 2 is formed of two diffusion layers, i.e., the buried layer 2A and the diffusion layer 2B, but the embodiment is not limited to this case. For example, the isolation layer may be formed of three or more diffusion layers connected to each other. In this case, the PN junction regions 11, 12 are formed on the diffusion layer disposed in the deep portion, and hence the surface portion of the epitaxial layer is protected from the thermal breakdown. In addition, the element-formation region 6 may be formed in an endless shape around the element-formation region 5 so as to be adjacent thereto, or may be formed to be adjacent to a part of the outer circumference of the element-formation region 5. Moreover, this embodiment is not limited to the case where the N type buried layer 9 and the N type diffusion layer 10 included in the protection element 1 are disposed in the element-formation region 6 defined by the isolation region 2. For example, the structure has only to include the protection element 1 together with the isolation region 2. It is needless to say that the same characteristics of the protection element 1 described above also apply to the structures of protection elements 42, 62, 82, 102, 122, 142 to be described below with reference to FIGS. 2A to 7.

Moreover, the description has been given for the case where a positive ESD surge is applied to the N type buried layer 7 forming the PN junction region 11, but the embodiment is not limited to this case. Even in a case where a negative ESD surge is applied to the N type buried layer 9 forming the PN junction region 12, the parasitic NPN transistor in the isolation region operates, and thereby the semiconductor element can be protected. An on-current of a parasitic Tr flows in the opposite direction to the on-current I1 of the parasitic Tr1, and thereby the surface portion of the epitaxial layer 4 is protected from the thermal breakdown. In other words, the protection element using the isolation region is capable of coping with both of the positive ESD surge and the negative ESD surge. Note that, in the structure illustrated in FIG. 1B, at least the N type buried layer 9 and the P type buried layer 2A need to be connected to each other to cope with the negative ESD surge.

Next, with reference to FIG. 4, a description will be given on a protection element 42 that protects an NPN transistor 41 from a surge voltage such as an ESD surge.

Figure 4:
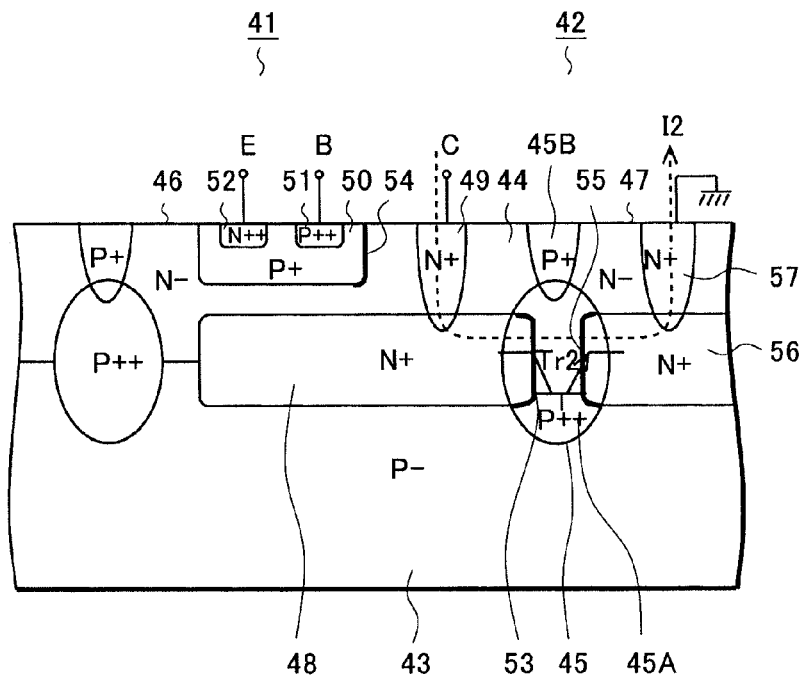
FIG. 4 is a cross-sectional view illustrating a semiconductor device according to a preferred embodiment of the present invention.

As shown in FIG. 4, an N type epitaxial layer 44 is formed on a P type single-crystal silicon substrate 43. The epitaxial layer 44 is divided into multiple element-formation regions 46, 47 by an isolation region 45. The isolation region 45 is formed of a P type buried layer 45A and a P type diffusion layer 45B connected to each other.

The NPN transistor 41 is formed in the element-formation region 46. An N type buried layer 48 is formed to stride across the substrate 43 and the epitaxial layer 44. An N type diffusion layer 49 serving as a collector region is formed in the epitaxial layer 44 in a way to be connected to the N type buried layer 48. A P type diffusion layer 50 serving as a base region is formed in the epitaxial layer 44. A P type diffusion layer 51 serving as a base lead region and an N type diffusion layer 52 serving as an emitter region are formed in the P type diffusion layer 50.

The protection element 42 has the same structure as described above with reference to FIG. 1A, and the description thereof is omitted. A PN junction region 53 of the protection element 42 is formed so that a junction breakdown voltage thereof should be lower than that of a PN junction region 54 in the NPN transistor 41. When a positive ESD surge (surge voltage) is applied to a collector electrode, the PN junction region 53 breaks down and then an on-current I2 of a parasitic Tr2 flows into the protection element 42. A PN junction region 55 operates in conjunction with this, and thus the protection element 42 is driven. As a result, the NPN transistor 41 is protected from the ESD surge. In addition, the on-current I2 of the parasitic Tr2 mainly flows through the N type diffusion layer 49, an N type diffusion layer 57, the N type buried layer 48, an N type buried layer 56, and the P type buried layer 45A (a deep portion), which are low resistance regions, and thereby the protection element 42 is protected from the thermal breakdown due to the on-current I2 of the parasitic Tr2.

Next, with reference to FIG. 5, a description will be given on a protection element 62 that protects a lateral-type PNP transistor 61 from a surge voltage such as an ESD surge.

Figure 5:
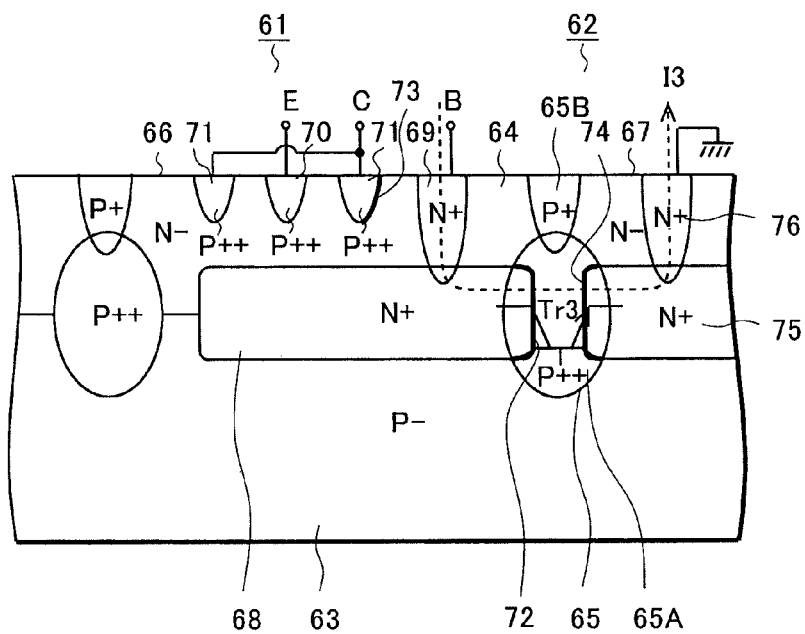
FIG. 5 is a cross-sectional view illustrating a semiconductor device according to a preferred embodiment of the present invention.

As shown in FIG. 5, an N type epitaxial layer 64 is formed on a P type single-crystal silicon substrate 63. The epitaxial layer 64 is divided into multiple element-formation regions 66, 67 by an isolation region 65. The isolation region 65 is formed of a P type buried layer 65A and a P type diffusion layer 65B connected to each other.

The lateral-type PNP transistor 61 is formed in the element-formation region 66. An N type buried layer 68 is formed to stride across the substrate 63 and the epitaxial layer 64. An N type diffusion layer 69 serving as a base region is formed in the epitaxial layer 64 in a way to be connected to the N type buried layer 68. A P type diffusion layer 70 serving as an emitter region and a P type diffusion layer 71 serving as a collector region are formed in the epitaxial layer 64.

The protection element 62 has the same structure as described above with reference to FIG. 1A, and the description thereof is omitted. A PN junction region 72 of the protection element 62 is formed so that a junction breakdown voltage thereof should be lower than that of a PN junction region 73 in the lateral-type PNP transistor 61. When a positive ESD surge (surge voltage) is applied to a base electrode, the PN junction region 72 breaks down and an on-current I3 of a parasitic Tr3 flows into the protection element 62. A PN junction region 74 operates in conjunction with this, and thus the protection element 62 is driven. As a result, the lateral-type PNP transistor 61 is protected from the ESD surge. In addition, the on-current I3 of the parasitic Tr3 mainly flows through the N type diffusion layer 69, an N type diffusion layers 76, the N type buried layer 68, an N type buried layer 75, and the P type buried layer 65A (a deep portion), which are low resistance regions, and thereby the protection element 62 is protected from the thermal breakdown due to the on-current I3 of the parasitic Tr3.

Next, with reference to FIG. 6, a description will be given on a protection element 82 that protects an N channel type MOS transistor 81 from a surge voltage such as an ESD surge.

Figure 6:
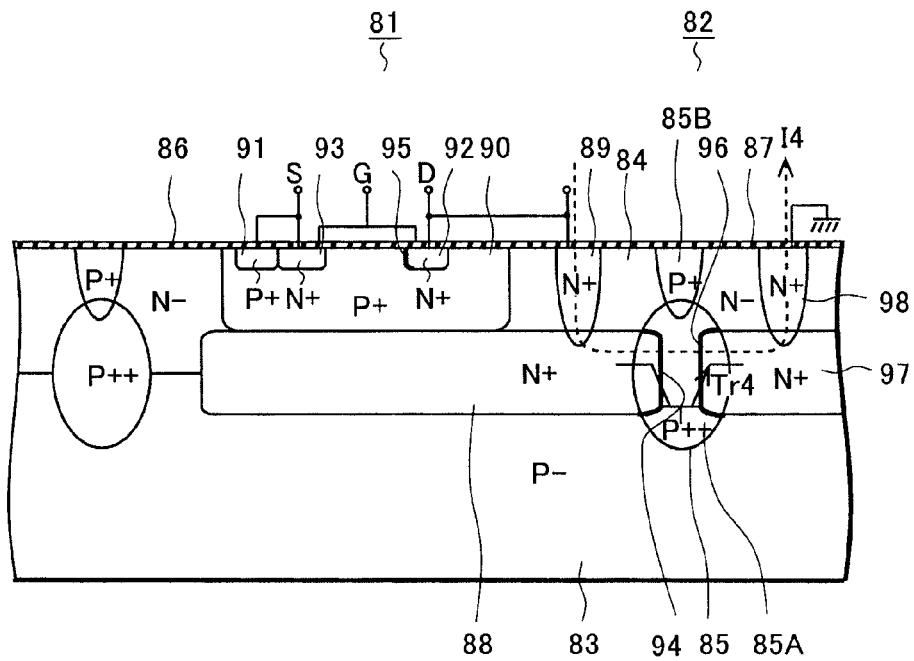
FIG. 6 is a cross-sectional view illustrating a semiconductor device according to a preferred embodiment of the present invention.

As shown in FIG. 6, an N type epitaxial layer 84 is formed on a P type single-crystal silicon substrate 83. The epitaxial layer 84 is divided into multiple element-formation regions 86, 87 by an isolation region 85. The isolation region 85 is formed of a P type buried layer 85A and a P type diffusion layer 85B connected to each other.

The N channel type MOS transistor 81 is formed in the element-formation region 86. An N type buried layer 88 is formed to stride across the substrate 83 and the epitaxial layer 84. An N type diffusion layer 89 is formed in the epitaxial layer 84 in a way to be connected to the N type buried layer 88. A P type diffusion layer 90 serving as a back-gate region is formed in the epitaxial layer 84. A P type diffusion layer 91 serving as a back-gate lead region, an N type diffusion layer 92 serving as a drain region and an N type diffusion layer 93 serving as a source region are formed in the P type diffusion layer 90. The N type diffusion layer 89 is connected to the N type diffusion layer 92 by wire, and thus a drain potential is substantially applied to the N type diffusion layer 89.

The protection element 82 has the same structure as described above with reference to FIG. 1A, and the description thereof is omitted. A PN junction region 94 of the protection element 82 is formed so that a junction breakdown voltage thereof should be lower than that of a PN junction region 95 in the N channel type MOS transistor 81. When a positive ESD surge (surge voltage) is applied to a drain electrode, the PN junction region 94 breaks down and an on-current I4 of a parasitic Tr4 flows into the protection element 82. A PN junction region 96 operates in conjunction with this, and thus the protection element 82 is driven. As a result, the N channel type MOS transistor 81 is protected from the ESD surge. In addition, the on-current I4 of the parasitic Tr4 mainly flows through the N type diffusion layer 89, an N type diffusion layer 98, the N type buried layer 88, an N type buried layer 97, and the P type buried layer 85A (a deep portion), which are low resistance regions, and thereby the protection element 82 is protected from the thermal breakdown due to the on-current I4 of the parasitic Tr4.

Next, with reference to FIG. 7, a description will be given on a protection element 102 that protects a P channel type MOS transistor 101 from a surge voltage such as an ESD surge. Note that, although not illustrated, a P channel type MOS transistor 101 of a lightly doped drain (LDD) structure which has the same structure as the P channel type MOS transistor 101 illustrated in FIG. 7 is protected from the surge voltage.

Figure 7:
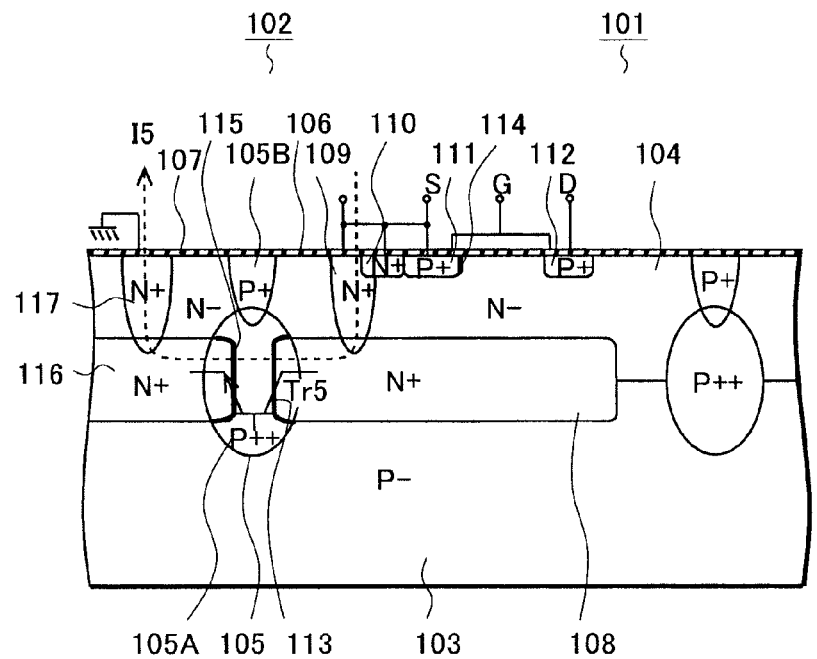
FIG. 7 is a cross-sectional view illustrating a semiconductor device according to a preferred embodiment of the present invention.

As shown in FIG. 7, an N type epitaxial layer 104 is formed on a P type single-crystal silicon substrate 103. The epitaxial layer 104 is divided into multiple element-formation regions 106, 107 by an isolation region 105. The isolation region 105 is formed of a P type buried layer 105A and a P type diffusion layer 105B connected to each other.

The P channel type MOS transistor 101 is formed in the element-formation region 106. An N type buried layer 108 is formed to stride across the substrate 103 and the epitaxial layer 104. An N type diffusion layer 109 is formed in the epitaxial layer 104 in a way to be connected to the N type buried layer 108. An N type diffusion layer 110 serving as a back-gate lead region, a P type diffusion layer 111 serving as a source region and a P type diffusion layer 112 serving as a drain region are formed in the epitaxial layer 104. The N type diffusion layer 109 is formed to overlap the N type diffusion layer 110, and a source potential is substantially applied to the N type diffusion layer 109. Note that the N type diffusion layer 110 may be directly connected to the N type buried layer 108 without forming the N type diffusion layer 109.

The protection element 102 has the same structure as described above with reference to FIG. 1A, and the description thereof is omitted. A PN junction region 113 of the protection element 102 is formed so that a junction breakdown voltage thereof should be lower than that of a PN junction region 114 in the P channel type MOS transistor 101. When a positive ESD surge (surge voltage) is applied to a source electrode, the PN junction region 113 breaks down and an on-current I5 of a parasitic Tr5 flows into the protection element 102. A PN junction region 115 operates in conjunction with this, and thus the protection element 102 is driven. As a result, the P channel type MOS transistor 101 is protected from the ESD surge. In addition, the on-current I5 of the parasitic Tr5 mainly flows through the N type diffusion layer 109, an N type diffusion layer 117, the N type buried layer 108, an N type buried layer 116, and the P type buried layer 105A (a deep portion), which are low resistance regions, and thereby the protection element 102 is protected from the thermal breakdown due to the on-current I5 of the parasitic Tr5.

Next, with reference to FIG. 8, a description will be given on a protection element 122 that protects an N channel type MOS transistor 121 of an LDD structure from a surge voltage such as an ESD surge.

Figure 8:
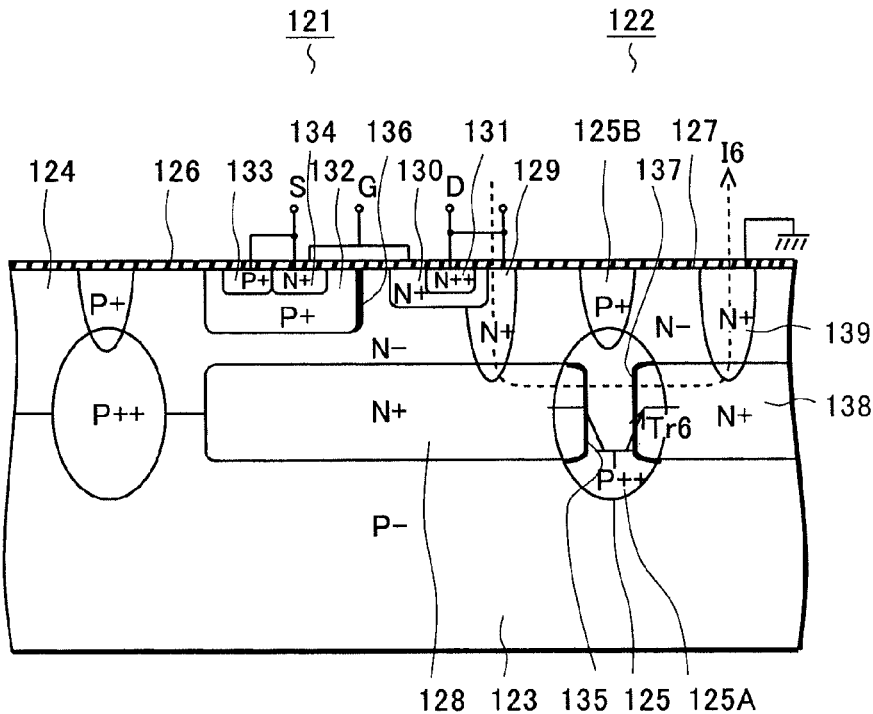
FIG. 8 is a cross-sectional view illustrating a semiconductor device according to a preferred embodiment of the present invention.

As shown in FIG. 8, an N type epitaxial layer 124 is formed on a P type single-crystal silicon substrate 123. The epitaxial layer 124 is divided into multiple element-formation regions 126, 127 by an isolation region 125. The isolation region 125 is formed of a P type buried layer 125A and a P type diffusion layer 125B connected to each other.

The N channel type MOS transistor 121 is formed in the element-formation region 126. An N type buried layer 128 is formed to stride across the substrate 123 and the epitaxial layer 124. An N type diffusion layer 129 is formed in the epitaxial layer 124 in a way to be connected to the N type buried layer 128. N type diffusion layers 130, 131 serving as drain regions are formed in the epitaxial layer 124. A P type diffusion layer 132 serving as a back-gate region is formed in the epitaxial layer 124. A P type diffusion layer 133 serving as a back-gate lead region and an N type diffusion layer 134 serving as a source region are formed in the P type diffusion layer 132. The N type diffusion layer 129 is formed to overlap the N type diffusion layer 130, and thus a drain potential is substantially applied to the N type diffusion layer 129.

The protection element 122 has the same structure as described above with reference to FIG. 1A, and the description thereof is omitted. A PN junction region 135 of the protection element 122 is formed so that a junction breakdown voltage thereof should be lower than that of a PN junction region 136 in the N channel type MOS transistor 121. When a positive ESD surge (surge voltage) is applied to a drain electrode, the PN junction region 135 breaks down and an on-current I6 of a parasitic Tr6 flows into the protection element 122. A PN junction region 137 operates in conjunction with this, and thus the protection element 122 is driven. As a result, the N channel type MOS transistor 121 is protected from the ESD surge. In addition, the on-current I6 of the parasitic Tr6 mainly flows through the N type diffusion layer 129, an N type diffusion layer 139, the N type buried layer 128, an N type buried layer 138, and the P type buried layer 125A (a deep portion), which are low resistance regions, and thereby the protection element 122 is protected from the thermal breakdown due to the on-current I6 of the parasitic Tr6.

Next, with reference to FIG. 9, a description will be given on a protection element 142 that protects a diffused resistor 141 from a surge voltage such as an ESD surge.

Figure 9:
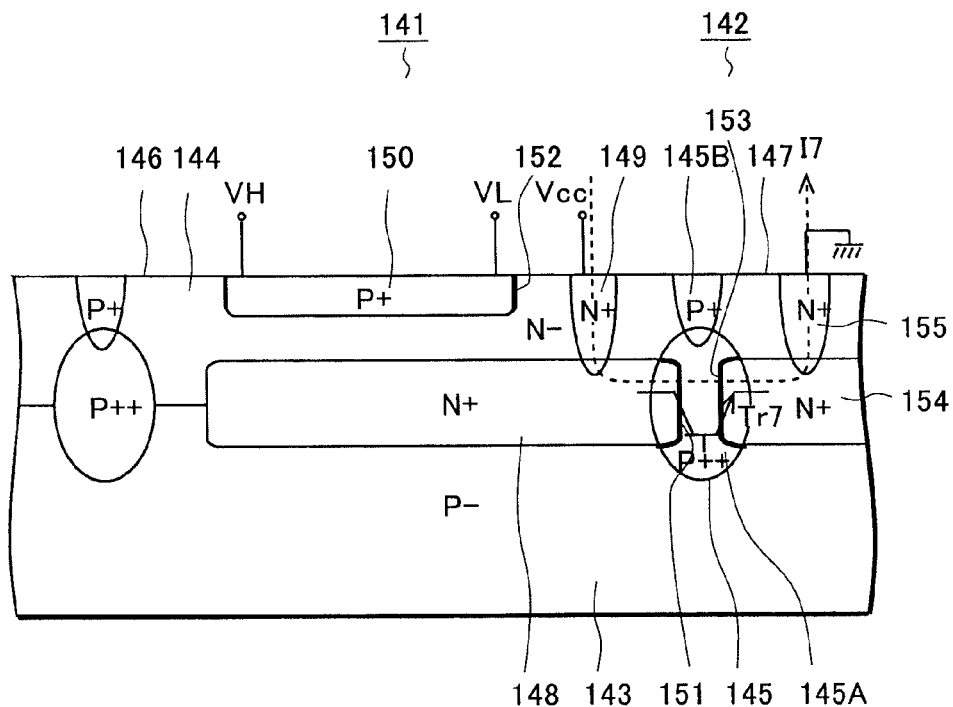
FIG. 9 is a cross-sectional view illustrating a semiconductor device according to a preferred embodiment of the present invention.
Figure 10:
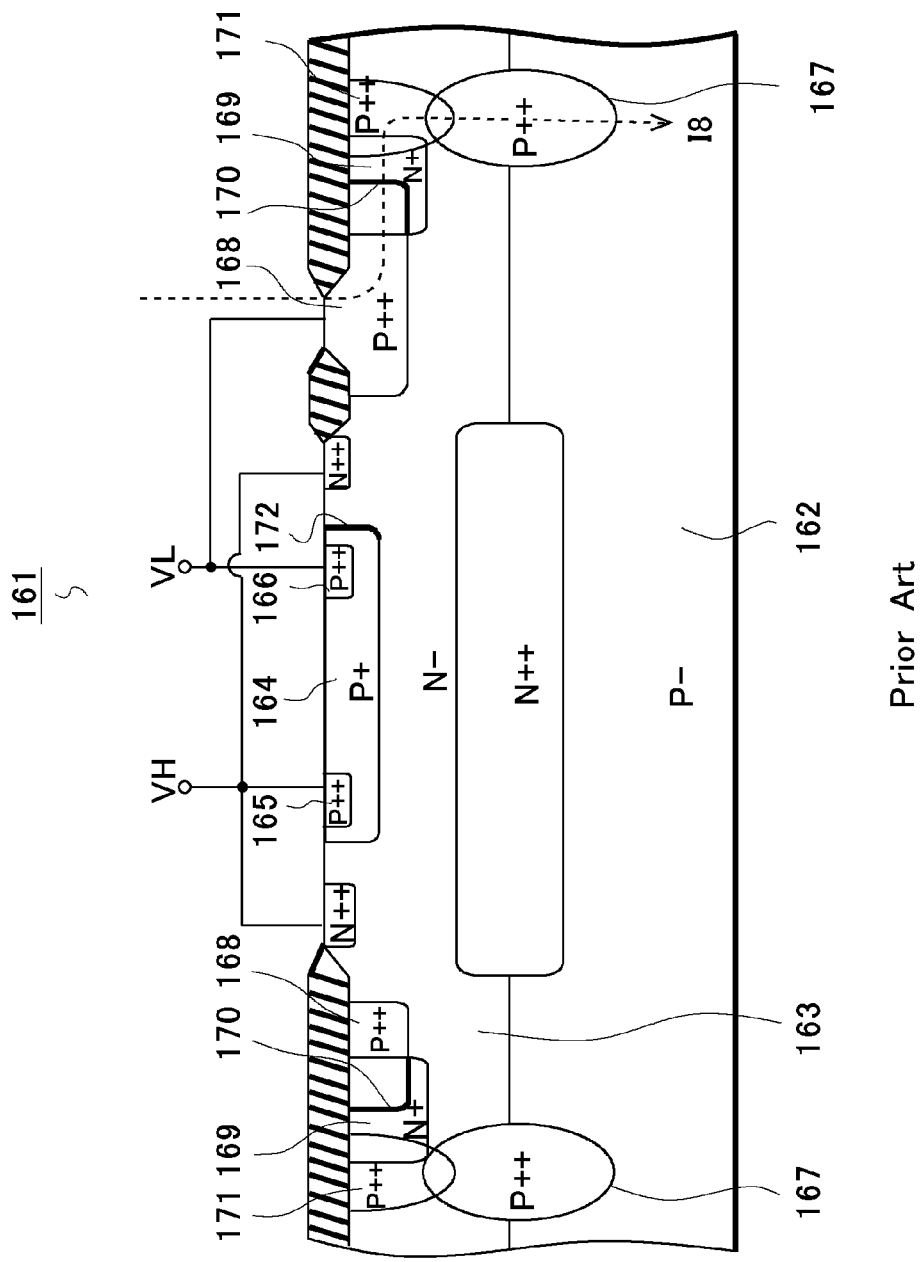
FIG. 10 is a cross-sectional view illustrating a semiconductor device according to a conventional embodiment.

As shown in FIG. 9, an N type epitaxial layer 144 is formed on a P type single-crystal silicon substrate 143. The epitaxial layer 144 is divided into multiple element-formation regions 146, 147 by an isolation region 145. The isolation region 145 is formed of a P type buried layer 145A and a P type diffusion layer 145B connected to each other.

The diffused resistor 141 is formed in the element-formation region 146. An N type buried layer 148 is formed to stride across the substrate 143 and the epitaxial layer 144. An N type diffusion layer 149 is formed in the epitaxial layer 144 in a way to be connected to the N type buried layer 148. A P type diffusion layer 150 is formed in the epitaxial layer 144. The N type diffusion layer 149 is used as a diffusion layer for applying a power supply potential (Vcc) to the epitaxial layer 144. Note that the P type diffusion layer 150 is used as a resistor, and hence a high potential (VH) and a low potential (VL) are applied thereto.

The protection element 142 has the same structure as described above with reference to FIG. 1A, and the description thereof is omitted. A PN junction region 151 of the protection element 142 is formed so that a junction breakdown voltage thereof should be lower than that of a PN junction region 152 of the diffused resistor 141. When a positive ESD surge (surge voltage) is applied to an electrode used for applying a voltage to the N type diffusion layer 149, the PN junction region 151 breaks down and an on-current I7 of a parasitic Tr7 flows into the protection element 142. A PN junction region 153 operates in conjunction with this, and thus the protection element 142 is driven. As a result, the diffused resistor 141 is protected from the ESD surge. In addition, the on-current I7 of the parasitic Tr7 mainly flows through the N type diffusion layer 149, an N type diffusion layer 155, the N type buried layer 148, an N type buried layer 154, and the P type buried layer 145A (a deep portion), which are low resistance regions, and thereby the protection element 142 is protected from the thermal breakdown due to the on-current I7 of the parasitic Tr7.

Note that the descriptions have been given on the protection elements using the structure, illustrated in FIG. 1A, of the isolation region with reference to FIGS. 4 to 9, but the embodiment is not limited to this. For example, the protection element using the structure of the isolation region illustrated in FIGS. 1B to 2B may be used. In addition, various modifications can be made within the scope of the preferred embodiments of the invention.

What is claimed is:

1. A semiconductor device comprising:
    a semiconductor layer;
    an isolation region dividing the semiconductor layer into a plurality of element-formation regions;
    a semiconductor element formed in a first element-formation region of the element-formation regions;
    a first diffusion layer formed in the first element-formation region and forming a first PN junction region with the isolation region that defines the first element-formation region; and
    a second diffusion layer formed in a second element-formation region of the element-formation regions, the first and second element-formation regions being disposed next to each other so as to be divided by the isolation region, and different voltages being applied to the first and second diffusion layers,
    wherein a junction breakdown voltage of the first PN junction region is lower than a junction breakdown voltage of an element PN junction region included in the semiconductor element,
    the first and second diffusion layers are each disposed at a bottom portion of the semiconductor layer and each have a lower resistance than the semiconductor layer, and
    at a time of breakdown, a current path is formed between the first and second diffusion layers through the isolation region.

2. The semiconductor device of claim 1, wherein the second diffusion layer is in contact with the isolation region so as to form a second PN junction region with the isolation region.

3. The semiconductor device of claim 1, wherein the isolation region comprises an upper portion and a lower portion that has a higher impurity concentration than the upper portion of the isolation region, and the lower portion of the isolation region is in contact with the first and second diffusion layers.

4. The semiconductor device of claim 1, wherein the isolation region comprises an upper portion comprising an insulating film and a lower portion comprising a diffusion layer, and the lower portion of the isolation region is in contact with the first and second diffusion layers.

5. The semiconductor device of claim 1, wherein the first PN junction region surrounds the first element-formation region in plan view of the semiconductor layer.

6. The semiconductor device of claim 3, wherein the first PN junction region comprises a PN junction between the lower portion of the isolation region and the first diffusion layer.

7. The semiconductor device of claim 1, wherein the semiconductor element is a bipolar transistor, a MOS transistor or a diffused resistor.

8. A protection element of a semiconductor device, comprising:
    a first semiconductor layer of a first general conductivity type;
    a second semiconductor layer of the first general conductivity type disposed on the first semiconductor layer and having an impurity concentration lower than the first semiconductor layer;
    a third semiconductor layer of the first general conductivity type disposed adjacent the first semiconductor layer;
    a fourth semiconductor layer of the first general conductivity type disposed on the third semiconductor layer and having an impurity concentration lower than the third semiconductor layer;
    a first contact diffusion layer of the first general conductivity type formed in the second semiconductor layer so as to be in contact with the first semiconductor layer and having an impurity concentration higher than the second semiconductor layer;
    a second contact diffusion layer of the first general conductivity type formed in the fourth semiconductor layer so as to be in contact with the third semiconductor layer and having an impurity concentration higher than the fourth semiconductor layer; and
    an isolation region isolating the first and second semiconductor layers from the third and fourth semiconductor layers and being in contact with the first and third semiconductor layers,
    wherein the first contact diffusion layer receives a power potential or ground potential, and the second contact diffusion layer receives the power potential or the ground potential that is not received by the first contact diffusion layer.

* * * * *